United States Patent [19]

Schweitzer, Jr.

[11] Patent Number: 5,095,265
[45] Date of Patent: Mar. 10, 1992

[54] CIRCUIT STATUS INDICATOR HAVING LIQUID CRYSTAL DISPLAY

[76] Inventor: Edmund O. Schweitzer, Jr., 2433 Center St., Northbrook, Ill. 60062

[21] Appl. No.: 577,080

[22] Filed: Aug. 31, 1990

Related U.S. Application Data

[63] Continuation of Ser. No. 433,665, Nov. 8, 1989, abandoned.

[51] Int. Cl.$^5$ .................... G01R 19/165; G01R 31/02
[52] U.S. Cl. ........................................ 324/133; 324/96; 324/543
[58] Field of Search ............... 324/133, 96, 126, 72, 324/119, 120, 511, 537, 543, 555; 350/331 R, 332, 352; 340/784, 811, 691, 660, 662, 664

[56] References Cited

U.S. PATENT DOCUMENTS

| | | | |
|---|---|---|---|
| 3,614,610 | 10/1971 | Legatti | 324/115 |
| 3,660,757 | 5/1972 | Winslow | 324/122 |
| 3,667,039 | 5/1972 | Garfein et al. | 324/92 |
| 3,774,195 | 11/1973 | Schulthess et al. | 340/324 |
| 3,906,477 | 9/1975 | Schweitzer, Jr. | 340/253 |
| 4,139,820 | 2/1979 | Rode | 324/133 |
| 4,152,639 | 5/1979 | Chaffee | 324/51 |
| 4,152,643 | 5/1979 | Schweitzer, Jr. | 324/120 |
| 4,259,634 | 3/1981 | Okamoto et al. | 324/74 |
| 4,263,550 | 4/1981 | Schweitzer, Jr. | 324/133 |
| 4,301,407 | 11/1981 | Koslar | 324/96 |
| 4,438,403 | 3/1984 | Schweitzer, Jr. | 324/133 |
| 4,458,198 | 7/1984 | Schweitzer, Jr. | 324/133 |
| 4,495,489 | 1/1985 | Schweitzer, Jr. | 340/664 |
| 4,503,389 | 3/1985 | Singer | 324/133 |
| 4,550,288 | 10/1985 | Schweitzer, Jr. | 324/133 |
| 4,559,496 | 12/1985 | Harnden, Jr. et al. | 324/127 |
| 4,641,220 | 2/1987 | Schweitzer, Jr. | 361/187 |
| 4,686,518 | 8/1987 | Schweitzer, Jr. | 340/664 |
| 4,714,916 | 12/1987 | Schweitzer, Jr. | 340/664 |
| 4,794,329 | 12/1988 | Schweitzer, Jr. | 324/127 |
| 4,794,332 | 12/1988 | Schweitzer, Jr. | 324/133 |
| 4,823,078 | 4/1989 | Mohebban | 324/96 X |

FOREIGN PATENT DOCUMENTS 1011161 12/1948 France .
1199016 7/1970 United Kingdom .

OTHER PUBLICATIONS

"Liquid Crystal Display", a publication of Hamlin Inc., Lake and Grove Street, Lake Mills, Wis., circa Jun. 1, 1989.
"Electronically Scanned Analog Liquid Crystal Displays", by R. A. Soref, *Applied Optics*, Jun. 1970, vol. 9, No. 6.

*Primary Examiner*—Jack B. Harvey
*Attorney, Agent, or Firm*—Lockwood, Alex, FitzGibbon & Cummings

[57] ABSTRACT

An indicator for instantaneously indicating the presence of voltage on a monitored electrical conductor of an AC power distribution system utilizes a high impedance liquid crystal display component providing an "N" display in response to an applied signal. The "N" segment display electrode and associated backplane display electrode are capacitively coupled to the monitored conductor and system ground to provide an "N" display when voltage is present on the conductor.

8 Claims, 3 Drawing Sheets

CIRCUIT STATUS INDICATOR HAVING LIQUID CRYSTAL DISPLAY

This application is a continuation of application Ser. No. 433,665, filed Nov. 8, 1989, now abandoned.

BACKGROUND OF THE INVENTION

The present invention is generally directed to circuit monitoring devices, and more particularly, to an improved circuit status indicator.

Various types of fault indicators have been constructed for detecting electrical faults in power distribution systems, including clamp-on type fault indicators, which clamp over a cable of the system and derive their operating power from the magnetic field surrounding the cable, and test-point mounted type fault indicators, which attach to test point sockets provided on connectors or other system components and derive their operating power by means of a capacitive coupling to the monitored conductor.

It is frequently desirable to utilize the test point socket to monitor circuit status by indicating to an observer whether the associated conductor is powered. Preferably, this should be accomplished by a self-powered test point socket-mounted module, which does not require external instruments or connections.

The present invention overcomes these drawbacks by providing a circuit status indicator which can be readily installed in the same manner as a standard fault indicator in a test point socket, and which incorporates a high impedance non-mechanical electronic indicator in the form of a liquid crystal display. This results in an improved indicator which is more compact and easier to manufacture, and which provides a preferred non-ambiguous indication to the user as to whether a monitored line is powered.

Accordingly, it is a general object of the present invention to provide a new and improved circuit status indicator.

It is a more specific object of the present invention to provide a circuit status indicator which avoids the use of electromechanical indicator mechanisms.

It is a still more specific object of the invention to provide a circuit status indicator which is more compact and easier to manufacture.

SUMMARY OF THE INVENTION

The invention is directed to a circuit status indicator for indicating the presence of voltage on a monitored electrical conductor. The indicator includes a housing, and status indicating means within the housing comprising a high impedance display device having at least a pair of display electrodes disposed in operative association with a layer of voltage-responsive light controlling material, the display device providing on the exterior of the housing a first display condition in the absence of an actuating signal applied to the display electrodes, and a second display condition in the presence of an actuating signal applied to the display electrodes. Circuit means within the housing apply an actuating signal to the display electrodes of the display device in response to the presence of voltage on the monitored conductor to condition the display device to the second display condition.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
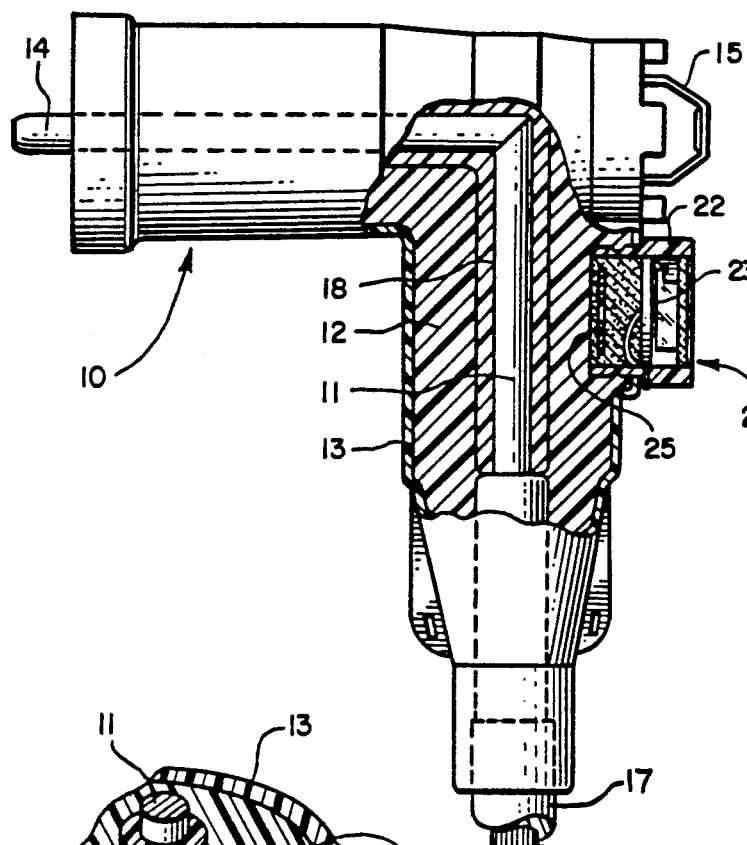
FIG. 1 is a side elevational view, partially in section, showing a circuit status indicator constructed in accordance with the invention installed in a connector test point socket in a power distribution system.
Figure 2:
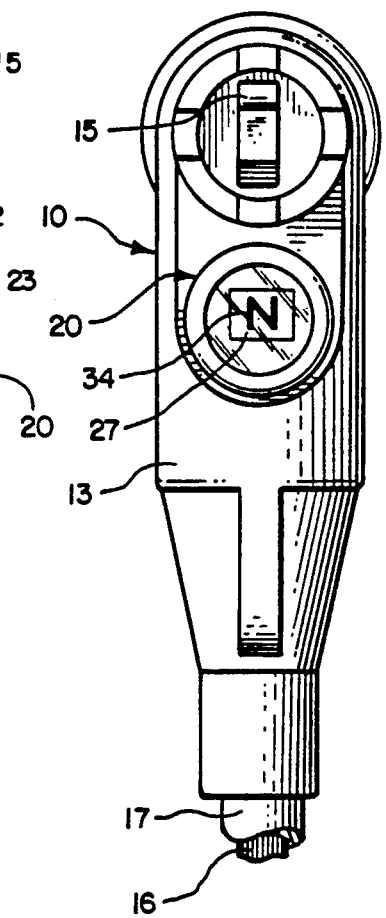
FIG. 2 is a front elevational view of the circuit status indicator and connector of FIG. 1 showing a powered indication of the indicator.

Referring to the drawings, and particularly to FIGS. 1-5, a plug-in type elbow connector for use in high voltage alternating current power distribution systems for establishing a plug-in connection to a transformer or other system component (not shown) is identified generally by reference numeral 10. As shown, the connector 10 includes generally a conductor 11 extending generally axially through an electrically non-conductive body portion 12 encased in an electrically-conductive sheath 13, the sheath being grounded in accordance with conventional practice. An electrically-conductive contact member 14 extends from conductor 11 to mate with a complementary contact on the associated system component. An arcuate member 15 having ends anchored in the conductive sheath 13 extends from the connector to receive the hooked end of a lineman's tool. The axial conductor 11 is connected, in accordance with conventional practice, to the conductor 16 of a flexible cable 17 of the type commonly utilized in power distribution systems. A layer 18 of semi-conductive material may be provided around conductor 11 to provide stress relief within the connector in a manner well known to the art.

To provide for detecting voltage presence in conductor 11 connector 10 includes a test point socket 19 for receiving a circuit status indicator module 20. The test point socket 19, which is preferably constructed as described in the copending application for U.S. Letters Patent of the present applicant, Ser. No. 253,427, filed Oct. 4, 1988, is formed within the insulating body portion of the connector, extending through the electrically-conductive outer sheath 13. In particular, this socket is preferably cylindrical in form and of an axial extent such that the test point socket 19 receives a substantial portion of the fault indicator housing.

Figure 3:
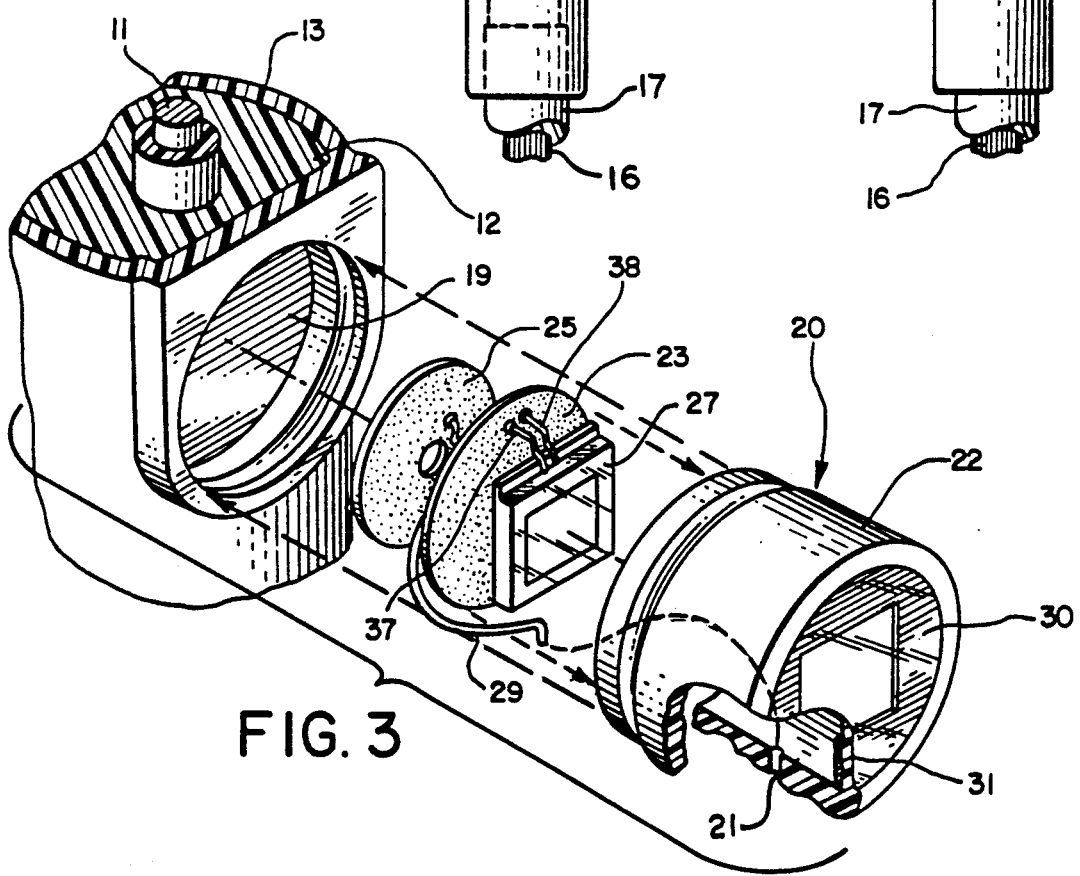
FIG. 3 is an enlarged exploded perspective view of the circuit status indicator and certain principal components thereof shown relative to the test point socket.
Figure 4:
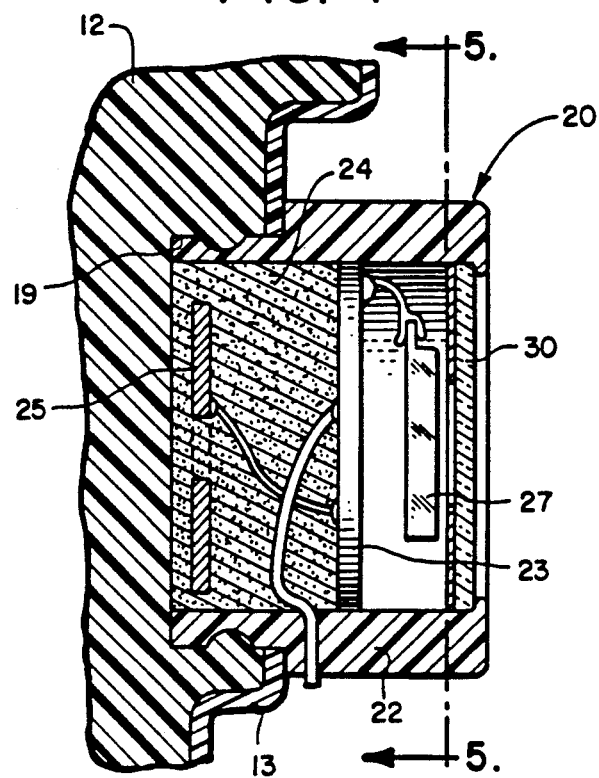
FIG. 4 is an enlarged cross-sectional view of the circuit status indicator installed in the test point socket.
Figure 5:
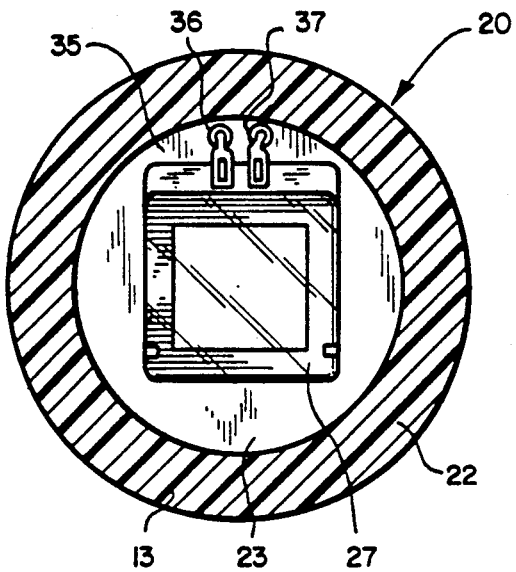
FIG. 5 is a cross-sectional view of the installed circuit status indicator taken along line 5—5 of FIG. 4.

The circuit status indicator module 20 is seen in FIGS. 3-5 to include a generally cylindrical housing 22 formed of an electrically conductive rubber or similar semi-resilient material within which the electrical components of the fault indicator are contained. In particular, within housing 22 the circuit status indicator module includes a disc-shaped insulator board 23 positioned perpendicularly to the axis of the housing at a location intermediate the ends thereof, and a layer 24 (FIG. 4) of high electrical resistance potting compound at the inside end of the housing for securing the insulator board in place. Additional electrical components included in housing 22 include, in accordance with the invention, a capacitive coupling element in the form of a metallic plate 25 for capacitively coupling the circuitry of the fault indicator to conductor 11, and a high impedance electronic display component 27 for visually indicating the occurrence of a fault current.

Operating power for circuit status indicator module 20 is derived from conductor 11 by means of the metallic plate 25, which when module 20 is seated in test point socket 19 is sufficiently closely spaced to the conductor to provide a level of capacitive coupling whereby an adequate alternating voltage is derived from the conductor. A necessary ground return may be provided, as shown in FIGS. 1-5, by an electrical conductor 29 which extends through an aperture 21 in the sidewall of housing 22. When housing 22 is seated in test point socket 19 conductor 29 is brought into electrical communication with the electrically grounded sheath 13 of the connector.

As shown in FIGS. 3 and 4, within housing 22 the liquid crystal display component 27 is positioned against a transparent window 30 such that the indicator face of the component is readily viewable from the exterior of the housing. A mask 31 formed of a thin sheet of opaque material may be provided on the inside surface of window 30 so that only the indicator face can be seen.

As shown in FIG. 5, the liquid crystal display component 27 is capable of producing an "N" display 34 to indicate the presence of voltage on conductor 11. Electrical connections are made with the component by means of two electrically conductive terminals 37 and 38 arranged along the top edge of the component.

Figure 6:
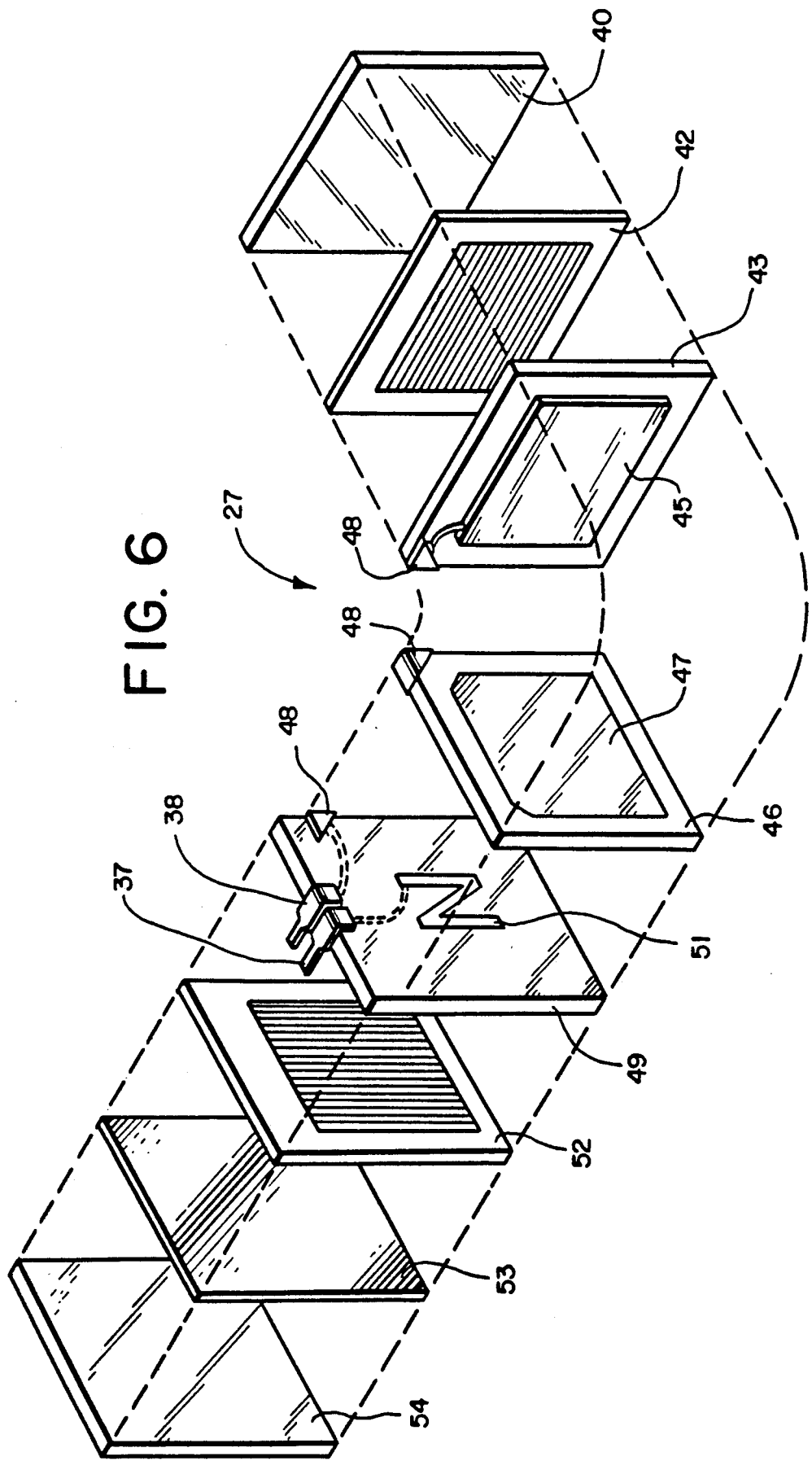
FIG. 6 is an enlarged exploded perspective view showing the principal elements of the liquid crystal display component utilized in the circuit status indicator of FIGS. 1-5.

Internally, as shown in FIG. 6, the liquid crystal display component 27 includes generally a transparent face plate 40, a front polarizer 42, a glass plate 43 on which a single transparent backplane electrode 45 is provided, a perimeter seal 46 containing a layer 47 of twisted nematic liquid crystal material, electrically conductive edge contacts 48, a glass plate 49 on which a single transparent indicator segment electrode 51 is contained, a rear polarizer 52 aligned at right angles to front polarizer 42, a reflector 53 and a rear supporting plate 54.

Display component 27 is conventional in construction and operation. The "N" display is formed by the nematic liquid crystal layer 47, which in the absence of an applied electric field has the property of rotating the polarization of light as it passes through the molecular layers of the layer. In particular, as randomly polarized light enters the display component through face plate 40, only vertically polarized light passes through front polarizer 42. In the absence of an applied electric field, the polarization of this polarized light is rotated 90° as it passes through the nematic liquid crystal layer 47 and reaches rear polarizer 50. Since the polarization of the light has been rotated the light is able to pass through this polarizer onto the reflective layer 51, wherein it is reflected back through polarizer 50, rotated by liquid crystal layer 47 and passed through polarizer 42 to front plate 40 and window 30. Thus, in the absence of an applied electric field light entering face plate 40 is passed through the device and reflected back out, presenting a blank or white colored appearance to the observer.

By applying an electric field between indicator segment electrode 51 and its associated backplane electrode 45 the liquid crystal layer in its intervening portions is caused to pass incoming light without rotating its polarization, thereby selectively blocking the transmission and reflection of light to the viewing window 30 in the "N" pattern and causing this character to be displayed to a viewer as a darkened letter.

Figure 7:
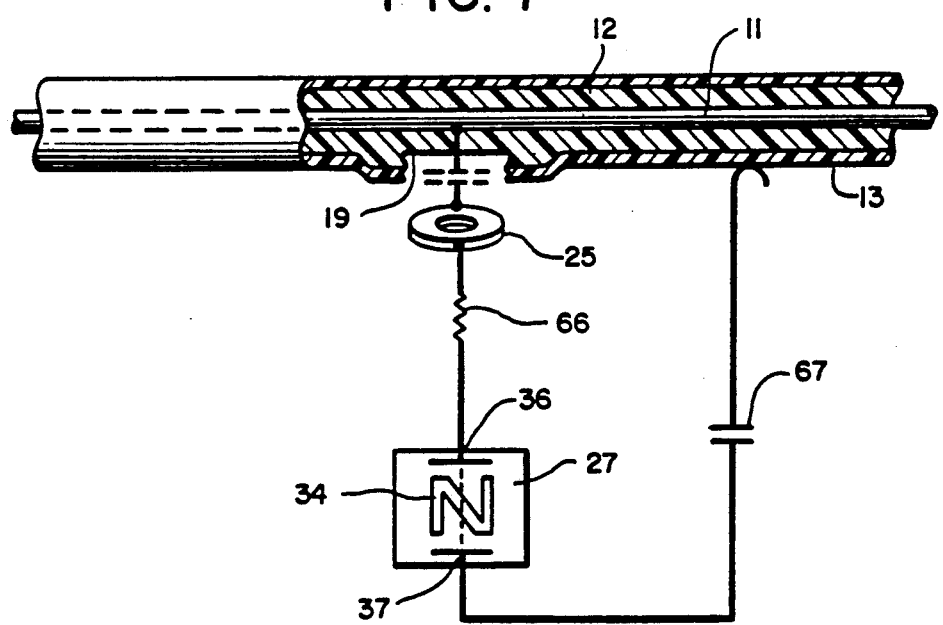
FIG. 7 is an electrical schematic diagram of the circuit status indicator of FIGS. 1-5.

Referring to FIG. 7, the necessary signal for actuating the "N" display is provided by a circuit within housing 22. In particular, the circuit connects the "N" display electrodes 45 and 51 of display component 27 to capacitive coupling plate 25 and system ground through a resistor 66 and a coupling capacitor 67. In the presence of alternating current on the monitored conductor the "N" display 34 is activated and the user is informed that the conductor is powered. Since there is no stored charge capacitor to be charged in association with the high impedance liquid crystal display component 27, the display indication is instantaneous, giving the user an immediate indication of circuit status.

Depending on the particular liquid crystal material used, LCD components exhibit a well defined threshold voltage below which the display does not respond to an applied signal. In one successful embodiment of the invention using a Type 7 LCD manufactured by Hamlin, Inc. of Lake Mills, Wisc., U.S.A., this threshold is 2.0 volts, which is sufficiently high to prevent the display from falsely responding to residual voltages.

The invention provides a highly reliable display of circuit status:

| Display | Condition |
| --- | --- |
| Blank | No system voltage |
| "N" | System energized |

While an "N" shaped display has been shown, it will be appreciated that other display characters, or symbols, can be used instead. For example, the "N" may be replaced with an "HL" (for "hot line") or a lightning bolt symbol.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A circuit status indicator for mounting on a monitored AC electrical conductor for indicating to a viewer the presence or absence of voltage on the monitored conductor, comprising:
    a housing adapted for mounting on the conductor;
    status indicating means within said housing comprising a high impedance display device having at least a pair of display electrodes disposed in operative association with a layer of voltage-responsive light controlling material, the display device providing on the exterior of said housing a first display condition in the absence of an actuating signal applied to said display electrodes, and a second display condition in the presence of an actuating signal applied to said display electrodes; and circuit means within said housing for capacitively coupling one display electrode to the monitored conductor, and for capacitively coupling the other display electrode to electrical ground, to apply an alternating current actuating signal to said display electrodes in the presence of an alternating current voltage on the monitored conductor whereby said display device indicates the status of the conductor.

2. A circuit status indicator as defined in claim 1 wherein said circuit means include a coupling plate disposed within said housing for capacitively coupling said one terminal of said display device to the monitored conductor, and a capacitor for capacitively coupling said other display electrode to electrical ground.

3. A circuit status indicator as defined in claim 2 wherein the monitored conductor includes an electrically conductive sheath, and said other display electrodes is connected to ground through said sheath.

4. A circuit status indicator as defined in claims 1 or 2 wherein said high impedance display device comprises a liquid crystal display wherein said display electrodes include a display segment electrode and an associated backplane electrode.

5. A circuit status indicator for mounting on a test point of the type providing a capacitive coupling to a monitored electrical conductor for indicating the presence of voltage on the monitored conductor, comprising:

a housing adapted for mounting on the conductor;

status indicating means within said housing comprising a high impedance display device having at least a pair of display electrodes disposed in operative association with a layer of voltage-responsive light controlling material, the display device providing on the exterior of said housing a first display condition in the absence of an actuating signal applied to said display electrodes, and a second display condition in the presence of an actuating signal applied to said display electrodes;

a coupling electrode for establishing a capacitive coupling to the monitored conductor; and circuit means for electrically coupling one said display electrodes to said coupling electrode, and for capacitively coupling the other of said display electrodes to electrical ground, whereby an alternating current voltage is impressed on said display electrodes and said display device is caused to display the status of the monitored conductor.

6. A circuit status indicator as defined in claim 5, wherein said housing is adapted for installation in a test point socket, and said coupling electrode comprises a capacitive coupling plate disposed for capacitive coupling to the monitored conductor when said housing is seated in the test point socket.

7. A circuit status indicator as defined in claim 6 wherein the monitored conductor includes an electrically conductive sheath, and said other of said display electrodes is connected to ground through said sheath.

8. A circuit status indicator as defined in claim 5 wherein said high impedance display device comprises a liquid crystal display wherein said display electrodes include a display segment electrode and an associated backplane electrode.

* * * * *